「12」 United States Patent
Rostovtsev et al.

(10) Patent No.: US 8,968,883 B2
(45) Date of Patent: *Mar. 3, 2015

(54) CHRYSENE DERIVATIVE MATERIALS

(75) Inventors: Vsevolod Rostovtsev, Swarthmore, PA (US); Weiying Gao, Landenberg, PA (US); Jeffrey A. Merlo, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 712 days.

This patent is subject to a terminal disclaimer.

(21) Appl. No.: 12/643,487

(22) Filed: Dec. 21, 2009

(65) Prior Publication Data

US 2011/0037381 A1    Feb. 17, 2011

Related U.S. Application Data

(60) Provisional application No. 61/233,592, filed on Aug. 13, 2009.

(51) Int. Cl.
*H01J 1/63* (2006.01)
*C07C 211/54* (2006.01)
*H01B 1/12* (2006.01)
(Continued)

(52) U.S. Cl.
CPC ............ *H01L 51/006* (2013.01); *C09K 11/06* (2013.01); *C09K 2211/1011* (2013.01); *C09K 2211/1014* (2013.01); *H01L 51/0085* (2013.01); *H01L 51/5012* (2013.01); *H01L 2251/5384* (2013.01)
USPC .............. 428/690; 564/426; 252/500

(58) Field of Classification Search
None
See application file for complete search history.

(56) References Cited

U.S. PATENT DOCUMENTS 4,053,311 A   10/1977  Limburg et al.
5,247,190 A    9/1993  Friend et al.
(Continued)

FOREIGN PATENT DOCUMENTS

CN  1668719 A   9/2005
CN  1711334 A  12/2005
(Continued)

OTHER PUBLICATIONS

Machine English translation of WO 2008/149968 A1. Nov. 16, 2014.*

(Continued)

*Primary Examiner* — J. L. Yang

(57) ABSTRACT

There is provided an electroluminescent composition. The composition includes a material having Formula I

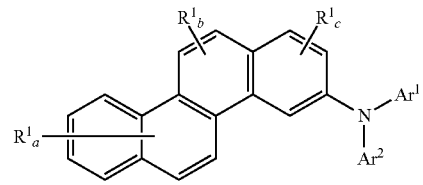

Formula I In Formula I: $R^1$ is the same or different at each occurrence and is selected from D, alkyl, alkoxy, silyl, and siloxane, or adjacent $R^1$ groups may be joined together to form a 5- or 6-membered aliphatic ring; $Ar^1$ and $Ar^2$ are the same or different and are aryl groups; a is an integer from 0 to 6; b is an integer from 0 to 2; and c is an integer from 0 to 3.

9 Claims, 1 Drawing Sheet

(51) Int. Cl.
*H01B 1/22* (2006.01)
*H01L 51/00* (2006.01)
*C09K 11/06* (2006.01)
*H01L 51/50* (2006.01)

(56) References Cited

U.S. PATENT DOCUMENTS

| | | | |
|---|---|---|---|
| 5,378,519 A | 1/1995 | Kikuchi et al. | |
| 5,408,109 A | 4/1995 | Heeger et al. | |
| 6,303,238 B1 | 10/2001 | Thompson et al. | |
| 6,670,645 B2 | 12/2003 | Grushin et al. | |
| 6,852,429 B1 | 2/2005 | Li et al. | 428/690 |
| 6,875,524 B2 | 4/2005 | Hatwar et al. | |
| 7,075,102 B2 | 7/2006 | Grushin et al. | |
| 7,173,131 B2 | 2/2007 | Saitoh et al. | |
| 7,351,358 B2 | 4/2008 | Hsu et al. | |
| 7,358,409 B2 | 4/2008 | Saitoh et al. | |
| 7,365,230 B2 | 4/2008 | Herron et al. | |
| 7,375,250 B2 | 5/2008 | Saitoh et al. | |
| 7,402,681 B2 | 7/2008 | Ong et al. | |
| 7,431,866 B2 | 10/2008 | Hsu et al. | |
| 7,462,298 B2 | 12/2008 | Hsu et al. | |
| 7,491,450 B2 | 2/2009 | Okinaka et al. | |
| 7,528,542 B2 | 5/2009 | Kawamura et al. | |
| 7,586,006 B2 | 9/2009 | Funahashi | |
| 7,651,786 B2 | 1/2010 | Matsuura et al. | |
| 7,651,788 B2 | 1/2010 | Seo et al. | |
| 7,709,104 B2 | 5/2010 | Saitoh et al. | |
| 8,026,665 B2 | 9/2011 | Kim et al. | |
| 2002/0076576 A1 | 6/2002 | Li et al. | 428/690 |
| 2003/0072966 A1 | 4/2003 | Hosokawa et al. | |
| 2003/0138657 A1* | 7/2003 | Li et al. | 428/621 |
| 2004/0102577 A1 | 5/2004 | Hsu et al. | |
| 2004/0106003 A1 | 6/2004 | Chen et al. | |
| 2004/0106004 A1 | 6/2004 | Li | |
| 2004/0121184 A1 | 6/2004 | Thompson et al. | |
| 2004/0127637 A1 | 7/2004 | Hsu et al. | |
| 2004/0209118 A1 | 10/2004 | Seo et al. | |
| 2004/0263067 A1 | 12/2004 | Saitoh et al. | |
| 2005/0031898 A1 | 2/2005 | Li et al. | |
| 2005/0064233 A1 | 3/2005 | Matsuura et al. | |
| 2005/0184287 A1 | 8/2005 | Herron et al. | |
| 2005/0205860 A1 | 9/2005 | Hsu et al. | |
| 2005/0244670 A1 | 11/2005 | Saitoh et al. | |
| 2005/0245752 A1 | 11/2005 | Conley et al. | |
| 2006/0033421 A1 | 2/2006 | Matsuura et al. | |
| 2006/0043858 A1 | 3/2006 | Ikeda et al. | |
| 2006/0052641 A1 | 3/2006 | Funahashi | |
| 2006/0103298 A1* | 5/2006 | Lee | 313/504 |
| 2006/0113528 A1 | 6/2006 | Okinaka et al. | |
| 2006/0115678 A1 | 6/2006 | Saitoh et al. | |
| 2006/0121312 A1 | 6/2006 | Yamada et al. | |
| 2006/0127698 A1 | 6/2006 | Tokailin et al. | |
| 2006/0134459 A1 | 6/2006 | Huo | |
| 2006/0152146 A1 | 7/2006 | Funahashi | |
| 2006/0158102 A1 | 7/2006 | Kawamura et al. | |
| 2006/0159838 A1 | 7/2006 | Kowalski et al. | |
| 2006/0194074 A1 | 8/2006 | Funahashi | |
| 2006/0210830 A1 | 9/2006 | Funahashi | |
| 2006/0217572 A1 | 9/2006 | Kawamura et al. | |
| 2006/0267488 A1 | 11/2006 | Saitoh et al. | |
| 2006/0284140 A1 | 12/2006 | Breuning et al. | |
| 2007/0031701 A1 | 2/2007 | Nakashima et al. | |
| 2007/0063638 A1 | 3/2007 | Tokairin et al. | |
| 2007/0114917 A1 | 5/2007 | Funahashi | 313/504 |
| 2007/0155991 A1* | 7/2007 | Funahashi | 564/426 |
| 2007/0236137 A1 | 10/2007 | Funahashi | 313/504 |
| 2007/0247063 A1 | 10/2007 | Murase et al. | |
| 2007/0255076 A1 | 11/2007 | Ito et al. | |
| 2007/0292713 A9 | 12/2007 | Dobbs et al. | |
| 2007/0298530 A1 | 12/2007 | Feehery | |
| 2008/0049413 A1 | 2/2008 | Jinde et al. | |
| 2008/0071049 A1 | 3/2008 | Radu et al. | |
| 2008/0086012 A1 | 4/2008 | Egawa et al. | |
| 2008/0114178 A1 | 5/2008 | Kawakami et al. | |
| 2008/0191614 A1 | 8/2008 | Kim et al. | |
| 2008/0233433 A1 | 9/2008 | Igarashi et al. | 428/704 |
| 2008/0286605 A1 | 11/2008 | Takeda | 428/690 |
| 2008/0303425 A1 | 12/2008 | Rostovtsev et al. | |
| 2008/0303428 A1 | 12/2008 | Rostovtsev et al. | |
| 2008/0315754 A1* | 12/2008 | Kawamura et al. | 313/504 |
| 2009/0058279 A1 | 3/2009 | Takeda | |
| 2009/0134781 A1* | 5/2009 | Jang et al. | 313/504 |
| 2009/0295274 A1 | 12/2009 | Hwang et al. | |
| 2010/0187505 A1 | 7/2010 | Stoessel et al. | |
| 2011/0147718 A1* | 6/2011 | Howard et al. | 257/40 |

FOREIGN PATENT DOCUMENTS

| | | | |
|---|---|---|---|
| CN | 1768029 A | 5/2006 | |
| CN | 1957646 A | 5/2007 | |
| EP | 443861 A2 | 7/1995 | |
| EP | 1061112 A1 | 12/2000 | |
| EP | 765106 A2 | 11/2002 | |
| EP | 1317005 A2 | 6/2003 | |
| EP | 1541657 A1 | 6/2005 | |
| EP | 1561794 A1 | 8/2005 | |
| EP | 1612202 A1 | 1/2006 | |
| EP | 1792893 A1 | 6/2007 | |
| EP | 1860096 A1 | 11/2007 | |
| EP | 1932895 A1 | 6/2008 | |
| EP | 2093271 A1 | 8/2009 | |
| EP | 2067766 A1 | 10/2009 | |
| EP | 2067767 A1 | 10/2009 | |
| JP | 07249490 A | 9/1995 | |
| JP | 08053397 A | 2/1996 | |
| JP | 2004-10550 A | 1/2004 | |
| JP | 2004515506 A | 5/2004 | |
| JP | 2006016384 A | 1/2006 | |
| JP | 2006052323 A | 2/2006 | |
| JP | 2006-151844 A | 6/2006 | |
| JP | 2006-219392 A | 8/2006 | |
| JP | 2007-186449 A | 7/2007 | |
| JP | 2009161470 A | 7/2009 | |
| KR | 10-2009-0046731 A | 5/2009 | |
| KR | 10-2009-0086015 A | 8/2009 | |
| KR | 10-2009-0086920 A | 8/2009 | |
| KR | 10-2009-0093897 A | 9/2009 | |
| WO | 0070655 A2 | 11/2000 | |
| WO | 0141512 A1 | 6/2001 | |
| WO | 0247440 A1 | 6/2002 | |
| WO | 03008424 A1 | 1/2003 | |
| WO | WO03/040257 A1 | 5/2003 | |
| WO | WO03/063555 A1 | 7/2003 | |
| WO | 03091688 A2 | 11/2003 | |
| WO | WO2004/016710 A1 | 2/2004 | |
| WO | 2004018587 A1 | 3/2004 | |
| WO | 2005000787 A1 | 1/2005 | |
| WO | 2005049546 A1 | 6/2005 | |
| WO | WO2005/052027 A1 | 6/2005 | |
| WO | 2006025273 A1 | 3/2006 | |
| WO | 2006112582 A1 | 10/2006 | |
| WO | 2006121237 A1 | 11/2006 | |
| WO | WO2007/021117 A1 | 2/2007 | |
| WO | WO2007-100096 A1 | 9/2007 | |
| WO | WO2007-105917 A1 | 9/2007 | |
| WO | WO 2007/108666 A1 * | 9/2007 | C07C 211/54 |
| WO | 2008147721 A1 | 12/2008 | |
| WO | WO 2008/149968 A1 * | 12/2008 | C07C 211/61 |
| WO | WO2009/018009 A1 | 2/2009 | |
| WO | WO2009/028902 A2 | 3/2009 | |
| WO | WO2009-055628 A1 | 4/2009 | |
| WO | 2009067419 A1 | 5/2009 | |
| WO | 2010071362 A2 | 6/2010 | |
| WO | 2010099534 A2 | 9/2010 | |
| WO | 2010135403 A2 | 11/2010 | |

OTHER PUBLICATIONS

International Search Report, Patent Cooperation Treaty, Korean Intellectual Property Office, Daejeon, Republic of Korea, Hyun Shik Oh, Authorized Officer, Sep. 6, 2010, in PCT/US2009/068956, PCT counterpart of the present application.

(56) References Cited

OTHER PUBLICATIONS

International Search Report, Korean Intellectual Property Office, Daejeon, Republic of Korea, Hyun Shik Oh, Authorized Officer, Aug. 13, 2010, in PCT/US2009/069255, PCT counterpart of the present application.
CRC Handbook of Chemistry and Physics, 81$^{st}$ Edition (2000-2001) (Book Not Included).
"Flexible light-emitting diodes made from soluble conducting polymer" Nature, vol. 357, pp. 477 479 (Jun. 11, 1992).
Kirk-Othmer Encyclopedia of Chemical Technology, Fourth Edition, vol. 18, pp. 837-860, 1996 Y. Wang.
Markus, John, Electronics and Nucleonics dictionary, 470 and 476 (McGraw-Hill 1966).
International Search Report, Korean Intellectual Property Office, Daejeon, Republic of Korea, in PCT/2009/068918, PCT copending U.S. Appl. No. 12/643,403, Jun Gyu Kim, Authorized Officer, Jul. 26, 2010.
International Search Report, Korean Intellectual Property Office, Daejeon, Republic of Korea, in PCT/2010/025764, PCT copending U.S. Appl. No. 12/714,880, Hyun Shik Oh, Authorized Officer, Sep. 27, 2010.
International Search Report, Korean Intellectual Property Office, Daejeon, Republie of Korea, PCT/US2009/068921, PCT copending U.S. Appl. No. 12/643,486, Hyun Shik Oh, Authorized Officer, Aug. 5, 2010.
International Search Report, Korean Intellectual Property Office, Daejeon, Republic of Korea, in PCT/2009/068922, PCT copending U.S. Appl. No. 12/643,567, Hyun Shik Oh, Authorized Officer, Oct. 20, 2010.
International Search Report, Korean Intellectual Property Office, Daejeon, Republic of Korea, in PCT/2009/068928, PCT copending U.S. Appl. No. 12/643,511, Hyun Shik Oh, Authorized Officer, Aug. 17, 2010.
International Search Report, Korean Intellectual Property Office, Daejeon, Republic of Korea, in PCT/2010/035356, PCT copending U.S. Appl. No. 12/782,781, Hyun Shik Oh, Authorized Officer, Dec. 24, 2010.
International Search Report, Korean Intellectual Property Office, Daejeon, Republic of Korea, in PCT/2009/068945, PCT copending U.S. Appl. No. 12/643,420, Hyun Shik Oh, Authorized Officer, Sep. 27, 2010.
International Search Report, Korean Intellectual Property Office, Daejeon, Republic of Korea, in PCT/2009/068950, PCT copending U.S. Appl. No. 12/643,449, Hyun Shik Oh, Authorized Officer, Jan. 3, 2011.
International Search Report, Korean Intellectual Property Office, Daejeon, Republic of Korea, in PCT/2009/068976, PCT copending U.S. Appl. No. 12/643,515, Bum Soo Kim, Authorized Officer, Jan. 28, 2011.
Beckmann et al., "Methyl Reorientation in Solid 3-ethychrysene and 3-isopropylesene; Solid State Nuclear Magnetic Resonance," 1998; vol. 12; pp. 251-256.
Carey et al., Structure and Mechanisms; Advanced Organic Chemistry, Part A, 5th Edition, pp. 142-145.
Danel et al., "Blue-Emitting Anthracenes with End-Capping Diarylamines," Chem. Mater., 2002, vol. 14, pp. 3860-3865.
Kim et al., "Synthesis and Electroluminescent Properties of Highly Efficient Anthracene Derivatives with Bulky Side Groups," Organic Electronics, 2009, vol. 10, No. 5, pp. 822-833.
Klaerner et al., "Cross-Linkable Polymers Based on Dialkylfluorenes," Chemistry of Materials, 1999, 11, pp. 1800-1805.
Kodomari et al., "Selective Halogenation o f Aromatic Hydrocarbons with Alumina-Supported Copper (III) Halides," Journal of Organic Chemistry,1988, vol. 53, p. 2093-2094.
Mueller et al., "Synthesis and Characterization of Soluble Oligo(9,10-anthrylene)s," Chemische Berichte, 1994, 127, pp. 437-444.
Negishi et al; III.2.15 Palladium Catalyzed Conjugate Substitution; Handbook of Organopalladium Chemistry for Organic Synthesis, 2000, vol. 1, pp. 767-789.
Tong et al., "Enhancement of OLED Efficiencies and High-Voltage Stabilities of Light-Emitting Materials by Deuteration," Journal of Physical Chemistry, 2007, vol. 111, pp. 3490-3494.
Weine et al., "Reactions of an O-Quinone Monoimide with Anthracenes, Phencyclone, and 1,3-Diphenylisobenzofuran," Journal of Organic Chemistry, 1989, vol. 54, pp. 5926-5930.
International Search Report Korean Intellectual Property Office, Daejeon, Republic of Korea, Hyun Shik Oh, Authorized Offier, Dec. 12, 2010, in PCT/US10/035364, PCT counterpart of co-pending U.S. Appl. No. 13/265,025.
International Search Report, European Patent Office, Rijswijk NL, in PCT/2008/063811, PCT copending U.S. Appl. No. 12/121,883, Csaba A. Nemes, Authorized Officer, Jul. 29, 2008.
International Search Report, European Patent Office, Rijswijk NL, in PCT/2008/065091, PCT copending U.S. Appl. No. 12/129,760, Alina Sen, Authorized Officer, Oct. 23, 2008.
International Search Report, European Patent Office, Rijswijk NL, in PCT/2008/065187, PCT copending U.S. Appl. No. 12/129,753, Cecile Vanier, Authorized Officer, Feb. 10, 2008.
International Search Report, Korean Intellectual Property Office, Daejeon, Republic of Korea, in PCT/2009/065163, PCT copending U.S. Appl. No. 13/120,001, Hyun Shik Oh, Authorized Officer, May 19, 2010.
International Search Report, Korean Intellectual Property Office, Daejeon, Republic of Korea, in PCT/2010/040578, PCT copending application, Hyun Shik Oh, Authorized Officer, Feb. 11, 2011.
Leznoff et al "Photocyclization of Aryl Polyenes. V. Photochemical Synthesis of Substituted Chrysenes," Canadian Journal of Chemistry, 1972, vol. 50, pp. 528-533.
Tokito et al., "Highly Efficient Blue-Green Emission from Organic Light-Emitting Diodes Using Dibenzochrysene Derivatives," Applied Physics Letters, 2000, vol. 77, No. 2, pp. 160-162.
Extended European Search Report for Application No. EP 09848342.3, counterpart to U.S. Appl. No. 12/643,487; Jan. 23, 2013.
Extended European Search Report for Application No. EP 09828227.0, counterpart to U.S. Appl. No. 13/120,001; Jul. 20, 2012.
Extended European Search Report for Application No. EP 09844464.9, counterpart to U.S. Appl. No. 12/643,511; Oct. 26, 2012.

* cited by examiner

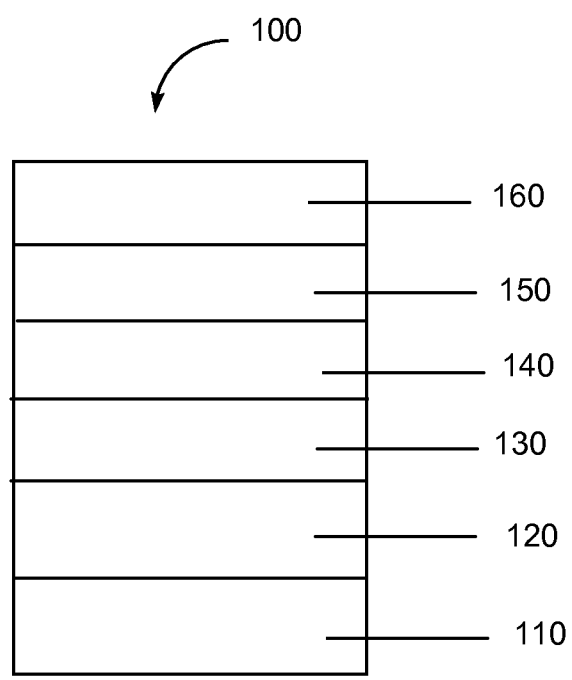

CHRYSENE DERIVATIVE MATERIALS

RELATED APPLICATION DATA

This application claims priority under 35 U.S.C. §119(e) from U.S. Provisional Application No. 61/233,592 filed on Aug. 13, 2009, which is incorporated by reference herein in its entirety.

BACKGROUND INFORMATION

1. Field of the Disclosure

This disclosure relates in general to chrysene derivative materials and their use in organic electronic devices.

2. Description of the Related Art

Organic electronic devices are present in many different kinds of electronic equipment. In all such devices, an organic electroactive layer is sandwiched between two electrical contact layers. One example of such devices is an organic light-emitting diode ("OLED"), in which a light-emitting layer is present between the electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties.

There is a continuing need for new materials for electronic devices.

SUMMARY

There is provided a chrysene derivative having Formula I

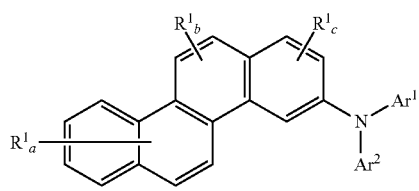

Formula I where:
- $R^1$ is the same or different at each occurrence and is selected from the group consisting of D, alkyl, alkoxy, silyl, and siloxane, or adjacent $R^1$ groups may be joined together to form a 5- or 6-membered aliphatic ring,
- $Ar^1$ and $Ar^2$ are the same or different and are aryl groups,
- a is an integer from 0 to 6;
- b is an integer from 0 to 2; and
- c is an integer from 0 to 3.

There is further provided an electroactive composition comprising (a) a host material having Formula I, as described above, and (b) an electroactive dopant capable of electroluminescence having an emission maximum between 380 and 750 nm.

There is further provided an organic electronic device comprising two electrical contact layers with an organic electroactive layer therebetween, wherein the electroactive layer comprises the electroactive composition described above.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Chrysene Derivative Materials, the Electroactive Composition, the Organic Electronic Device, and finally Examples.

1. DEFINITIONS AND CLARIFICATION OF TERMS

Before addressing details of embodiments described below, some terms are defined or clarified.

As used herein, phrase "adjacent to," when used to refer to layers in a device, does not necessarily mean that one layer is immediately next to another layer. On the other hand, the phrase "adjacent R groups," is used to refer to R groups that are next to each other in a chemical formula. Thus, adjacent, R groups are on atoms joined by a bond, e.g.,

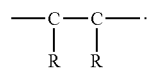

The term "aliphatic ring" is intended to mean a cyclic group that does not have delocalized pi electrons. In some embodiments, the aliphatic ring has no unsaturation. In some embodiments, the ring has one double or triple bond.

The term "alkyl" is intended to mean a group derived from an aliphatic hydrocarbon having one point of attachment, and includes a linear, a branched, or a cyclic group. The term is intended to include heteroalkyls. The term "alkylene" is intended to mean a group derived from an aliphatic hydrocarbon and having two or more points of attachment. In some embodiments, an alkyl group has from 1-20 carbon atoms.

The term "aryl" is intended to mean a group derived from an aromatic hydrocarbon having one point of attachment. The term includes groups which have a single ring and those which have multiple rings which can be joined by a single bond or fused together. The term is intended to include heteroaryls. The term "arylene" is intended to mean a group derived from an aromatic hydrocarbon having two points of attachment. In some embodiments, an aryl group has from 3-60 carbon atoms.

The term "blue light-emitting material" is intended to mean a material capable of emitting radiation that has an emission maximum at a wavelength in a range of approximately 400-480 nm.

The term "branched alkyl" refers to an alkyl group having at least one secondary or tertiary carbon. The term "secondary alkyl" refers to a branched alkyl group having a secondary carbon atom. The term "tertiary alkyl" refers to a branched alkyl group having a tertiary carbon atom. In some embodiments, the branched alkyl group is attached via a secondary or tertiary carbon.

The term "compound" is intended to mean an electrically uncharged substance made up of molecules that further consist of atoms, wherein the atoms cannot be separated by physical means.

The term "deuterated" is intended to mean that at least one H has been replaced by D. The term "deuterated analog" refers to a structural analog of a compound or group in which one or more available hydrogens have been replaced with deuterium. In a deuterated compound or deuterated analog, the deuterium is present in at least 100 times the natural abundance level.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "electroluminescence" refers to the emission of light from a material in response to an electric current passed through it. "Electroluminescent" refers to a material that is capable of electroluminescence.

The term "emission maximum" is intended to mean the highest intensity of radiation emitted. The emission maximum has a corresponding wavelength.

The prefix "fluoro" indicates that one or more available hydrogen atoms have been replaced with a fluorine atom.

The term "green light-emitting material" is intended to mean a material capable of emitting radiation that has an emission maximum at a wavelength in a range of approximately 480-600 nm.

The prefix "hetero" indicates that one or more carbon atoms have been replaced with a different atom. In some embodiments, the different atom is N, O, or S.

The term "host material" is intended to mean a material to which a dopant is added. The host material may or may not have electronic characteristic(s) or the ability to emit, receive, or filter radiation. In some embodiments, the host material is present in higher concentration The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device," or sometimes just "electronic device," is intended to mean a device including one or more organic semiconductor layers or materials.

The term "red light-emitting material" is intended to mean a material capable of emitting radiation that has an emission maximum at a wavelength in a range of approximately 600-700 nm.

The term "siloxane" refers to the group $(RO)_3Si$—, where R is H, D, C1-20 alkyl, or fluoroalkyl.

The term "silyl" refers to the group $R_3Si$—, where R is H, D, C1-20 alkyl, fluoroalkyl, or aryl. In some embodiments, one or more carbons in an R alkyl group are replaced with Si. In some embodiments, the silyl groups are $(hexyl)_2Si(CH_3)CH_2CH_2Si(CH_3)_2$— and $[CF_3(CF_2)_6CH_2CH_2]_2Si(CH_3)$—.

All groups may be unsubstituted or substituted. In some embodiments, the substituents are selected from the group consisting of D, halide, alkyl, alkoxy, aryl, aryloxy, and fluoroalkyl.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is citedIn case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. CHRYSENE DERIVATIVE MATERIALS

The chrysene derivative materials have Formula I

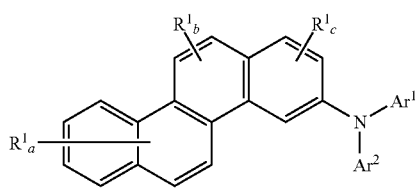

Formula I where:
R$^1$ is the same or different at each occurrence and is selected from the group consisting of D, alkyl, alkoxy, silyl, and siloxane, or adjacent R$^1$ groups may be joined together to form a 5- or 6-membered aliphatic ring,
Ar$^1$ and Ar$^2$ are the same or different and are aryl groups,
a is an integer from 0 to 6;
b is an integer from 0 to 2; and
c is an integer from 0 to 3.

In some embodiments, R$^1$ is D and at least one of a, b, and c is greater than 0. In some embodiments, R$^1$ is D and a, b and c are all greater than 0. In some embodiments R$^1$ is D, a=5-6, b=1-2 and c=2-3.

In some embodiments, at least one R$^1$ is a branched alkyl group. In some embodiments, the branched alkyl group is 2-propyl group or a t-butyl group.

In some embodiments, Ar$^1$ and Ar$^2$ are phenyl groups having a substituent selected from the group consisting of D, alkyl, silyl, phenyl, naphthyl, N-carbazolyl, and fluorenyl.

In some embodiments, Ar$^1$ and Ar$^2$ are selected from the group consisting of phenyl, biphenyl, naphthyl, phenanthryl, anthracenyl, 4-naphthylphenyl, 4-phenanthrylphenyl, where any of the preceding groups may be further substituted with one or more substituents selected from the group consisting of D, alkyl groups, silyl groups, and phenyl, and a group having Formula II:

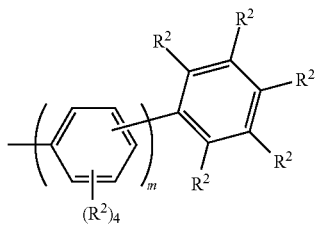

Formula II where:
R$^2$ is the same or different at each occurrence and is selected from the group consisting of H, D, alkyl, alkoxy, siloxane and silyl, or adjacent R$^2$ groups may be joined together to form an aromatic ring; and m is the same or different at each occurrence and is an integer from 1 to 6.

In some embodiments, Ar$^1$ and Ar$^2$ are selected from the group consisting of phenyl, naphthyl, phenanthryl, anthracenyl, 4-naphthylphenyl, 4-phenanthrylphenyl, where any of the preceding groups may be further substituted with one or more substituents selected from the group consisting of D, alkyl groups, silyl groups, phenyl, and a group having Formula III:

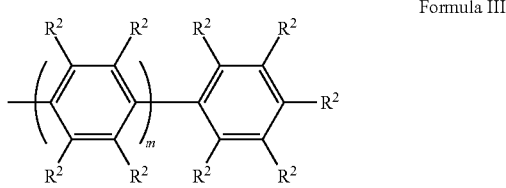

Formula III where R$^2$ and m are as defined above for Formula II. In some embodiments, m is an integer from 1 to 3.

As used herein, the terms biphenyl, naphthyl, phenanthryl, 4-naphthylphenyl, 4-phenanthrylphenyl, and N-carbazolylphenyl refer to the following substituent groups, where the dashed lines indicate the possible points of attachment to the nitrogen:

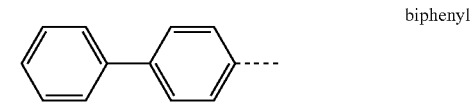

biphenyl

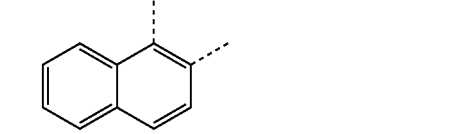

naphthyl

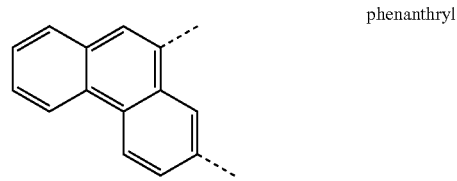

phenanthryl

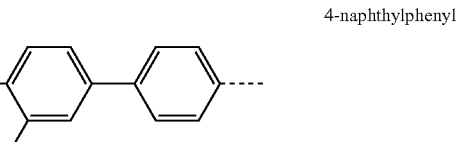

4-naphthylphenyl

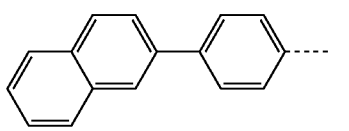

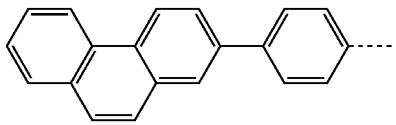

4-phenanthrylphenyl

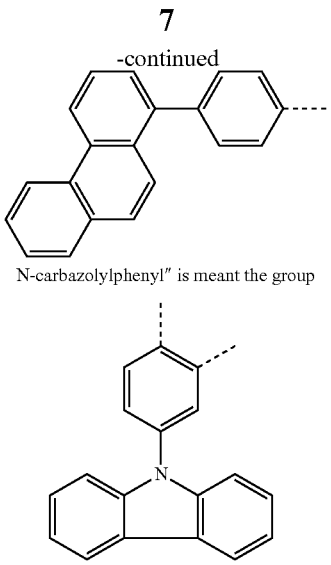

N-carbazolylphenyl" is meant the group

Any of the above groups may further be substituted with D, alkyl, silyl, or phenyl groups.

In some embodiments, $Ar^1$ and $Ar^2$ are selected from the group consisting of phenyl, biphenyl, terphenyl, naphthylphenyl, and deuterated analogs thereof. In some embodiments, $Ar^1 \neq Ar^2$.

In some embodiments, the chrysene compound is selected from compounds C1 through C5 below.

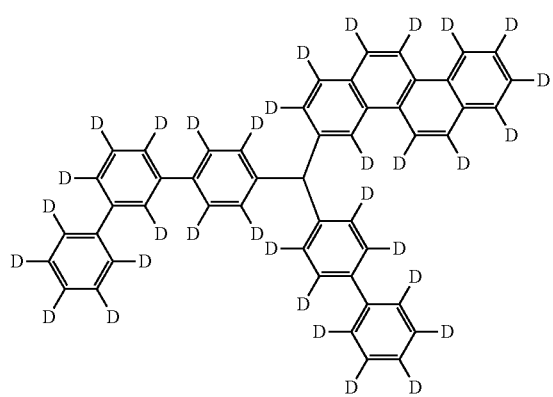

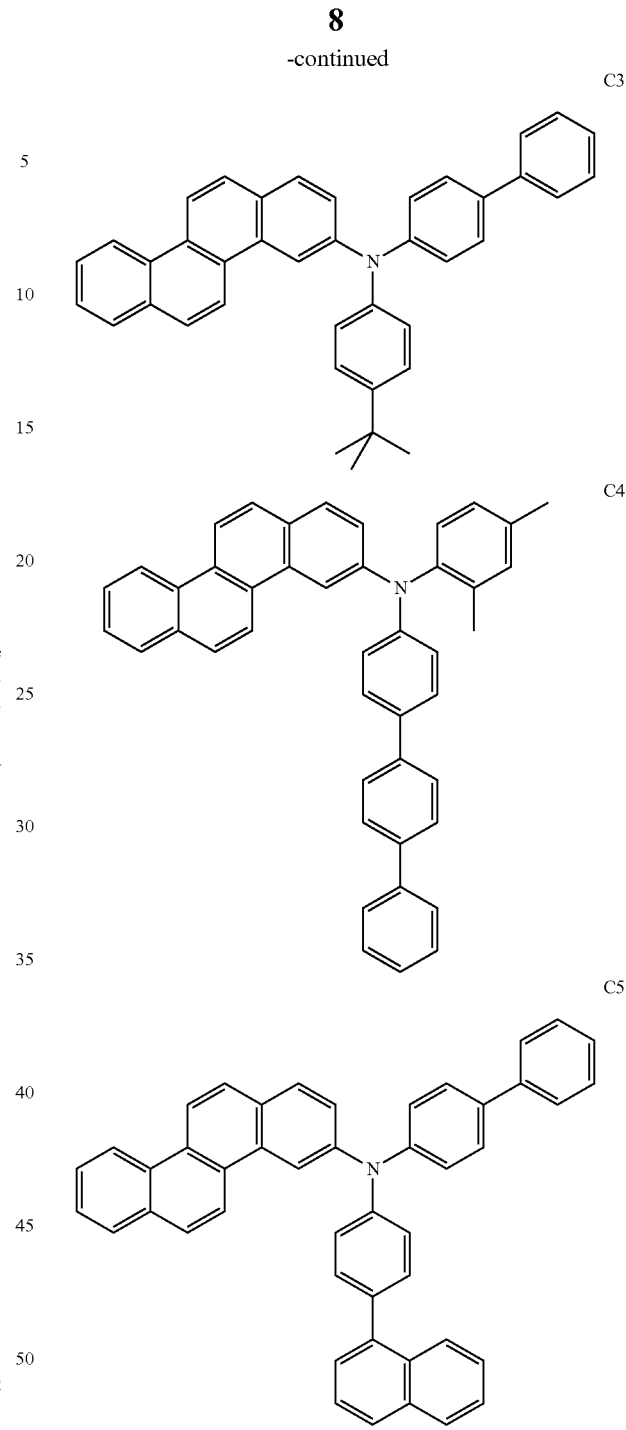

The chrysene derivatives can be prepared by known coupling and substitution reactions. Exemplary preparations are given in the Examples.

3. ELECTROACTIVE COMPOSITION

In electronic devices, there are electroactive compositions comprising electroluminescent materials. The electroluminescent materials are frequently present as dopants in host materials. Aluminum quinoline complexes, such as bis(2-methyl-8-quinolinato)-4-phenylphenolate aluminum (BAlq) are frequently used as host materials, particularly for phosphorescent metal complex emitters. However, BAlq compounds are air and moisture sensitive. Potential substitutes such as Ga-quinoline complexes have better air and moisture stability, but give lower device performance. There is therefore a need for better hosts.

The present inventors have discovered that the chrysene derivative compounds of Formula I have increased triplet energy and therefore are suitable as host materials for both phosphorescent and fluorescent light-emitting materials. In some embodiments, the first host material has a triplet energy level greater than 2.0 eV. This is particularly useful when the dopant is a phosphorescent material in order to prevent quenching of the emission. The triplet energy can either be calculated a priori, or be measured using pulse radiolysis or low temperature luminescence spectroscopy.

In addition, the chrysene derivative materials described herein are air stable and moisture insensitive. Solutions that are exposed to air for up to 20 hours are found to give the same performance in efficiency and lifetime as solutions that have never been exposed air.

Furthermore, the chrysene derivative materials described herein have glass transition temperatures ("Tg") which are sufficiently high so that they can be used in liquid compositions for solution processing. In some embodiments, Tg is greater than 95° C. The high Tg allows for the formation of smooth and robust films. There are two primary ways in which Tg is routinely measured: Differential Scanning Calorimetry ("DSC"), and Thermo-Mechanical Analysis ("TMA"). In some embodiments, the Tg is measured by DSC. In some embodiments the Tg is between 100° and 150° C.

It is also noted that solubility of the chrysene derivative materials in processing solvents can be adjusted to satisfy solution processing requirements. In some embodiments the solubility of chrysene derivatives in toluene and anisole is higher than 20 mg per ml of solvent. High solubility allows for better solution processing of electroactive devices.

An electroactive composition comprises (a) a host material having Formula I

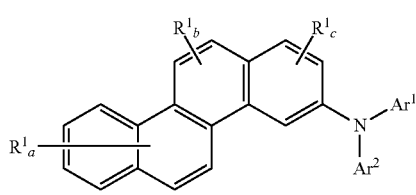

Formula I where:
  $R^1$ is the same or different at each occurrence and is selected from the group consisting of D, alkyl, alkoxy, silyl, and siloxane, or adjacent $R^1$ groups may be joined together to form a 5- or 6-membered aliphatic ring,
  $Ar^1$ and $Ar^2$ are the same or different and are aryl groups,
  a is an integer from 0 to 6;
  b is an integer from 0 to 2; and
  c is an integer from 0 to 3; and
(b) an electroactive dopant capable of electroluminescence having an emission maximum between 380 and 750 nm.

In some embodiments, a second host material is present. In some embodiments, the second host material is selected from the group consisting of phenanthrolines, quinoxalines, phenylpyridines, benzodifurans, and metal quinolinate complexes.

In some embodiments, more than one dopant is present.

In some embodiments, the electroactive composition consists essentially of (a) a host material having Formula I and (b) an electroactive dopant capable of electroluminescence having an emission maximum between 380 and 750 nm.

In some embodiments, the electroactive composition consists essentially of (a) a host material having Formula I, (b) an electroactive dopant capable of electroluminescence having an emission maximum between 380 and 750 nm, and (c) a second host material.

The amount of dopant present in the electroactive composition is generally in the range of 3-20% by weight, based on the total weight of the composition; in some embodiments, 5-15% by weight. When a second host is present, the ratio of first host to second host is generally in the range of 1:20 to 20:1; in some embodiments, 5:15 to 15:5. In some embodiments, the first host material having Formula I is at least 50% by weight of the total host material; in some embodiments, at least 70% by weight.

a. Dopant Materials

The dopant is an electroactive material which is capable of electroluminescence having an emission maximum between 380 and 750 nm. In some embodiments, the dopant emits red, green, or blue light.

Examples of red light-emitting materials include, but are not limited to, cyclometalated complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, bis(diarylamino)anthracenes, and polyphenylenevinylene polymers. Green light-emitting materials have been disclosed in, for example, published PCT application WO 2007/021117.

Examples of blue light-emitting materials include, but are not limited to, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, the dopant is an organometallic complex. In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is a complex having the formula $Ir(L1)_a(L2)_b(L3)_c$; where
  L1 is a monoanionic bidentate cyclometalating ligand coordinated through carbon and nitrogen;
  L2 is a monoanionic bidentate ligand which is not coordinated through a carbon;
  L3 is a monodentate ligand;
  a is 1-3;
  b and c are independently 0-2; and
  a, b, and c are selected such that the iridium is hexacoordinate and the complex is electrically neutral.

Some examples of formulae include, but are not limited to, $Ir(L1)_3$; $Ir(L1)_2(L2)$; and $Ir(L1)_2(L3)(L3')$, where L3 is anionic and L3' is nonionic.

Examples of L1 ligands include, but are not limited to phenylpyridines, phenylquinolines, phenylpyrimidines, phenylpyrazoles, thienylpyridines, thienylquinolines, and thienylpyrimidines. As used herein, the term "quinolines" includes "isoquinolines" unless otherwise specified. The fluorinated derivatives can have one or more fluorine substituents. In some embodiments, there are 1-3 fluorine substituents on the non-nitrogen ring of the ligand.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Monodentate ligand L3 can be anionic or nonionic. Anionic ligands include, but are not limited to, H⁻ ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.

In some embodiments, the dopant is a red light-emitting material. Some non-limiting examples of red dopants are compounds D1 through D7 below.

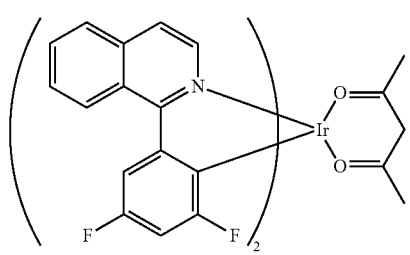

In some embodiments, the dopant is an organic compound. In some embodiments, the dopant is selected from the group consisting of a non-polymeric spirobifluorene compound and a fluoranthene compound.

In some embodiments, the dopant is a compound having aryl amine groups. In some embodiments, the electroluminescent dopant is selected from the formulae below:

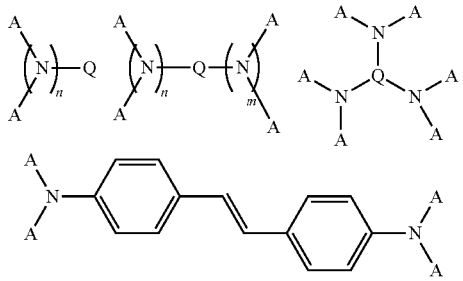

where:

A is the same or different at each occurrence and is an aromatic group having from 3-60 carbon atoms;

Q is a single bond or an aromatic group having from 3-60 carbon atoms;

n and m are independently an integer from 1-6.

In some embodiments of the above formula, at least one of A and Q in each formula has at least three condensed rings. In some embodiments, m and n are equal to 1.

In some embodiments, Q is a styryl or styrylphenyl group.

In some embodiments, Q is an aromatic group having at least two condensed rings. In some embodiments, Q is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, biphenyl, tolyl, naphthyl, naphthylphenyl, and anthracenyl groups.

In some embodiments, the dopant has the formula below:

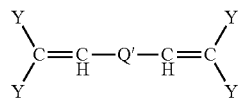

where:

Y is the same or different at each occurrence and is an aromatic group having 3-60 carbon atoms;

Q' is an aromatic group, a divalent triphenylamine residue group, or a single bond.

In some embodiments, the dopant is an aryl acene. In some embodiments, the dopant is a non-symmetrical aryl acene.

In some embodiments, the dopant is an anthracene derivative having formula IV:

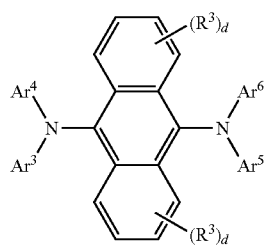

Formula IV wherein:

R$^3$ is the same or different at each occurrence and is selected from the group consisting of D, alkyl, alkoxy and aryl, where adjacent R$^3$ groups may be joined together to form a 5- or 6-membered aliphatic ring;

Ar$^3$ through Ar$^6$ are the same or different and are selected from the group consisting of aryl groups;

d is the same or different at each occurrence and is an integer from 0 to 4; and In some embodiments, the dopant is a chrysene derivative having Formula V:

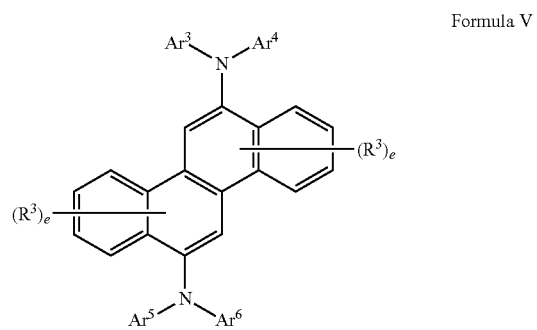

Formula V wherein:

R$^3$ is the same or different at each occurrence and is selected from the group consisting of D, alkyl, alkoxy aryl, fluoro, cyano, nitro, —SO$_2$R$^4$, where R$^4$ is alkyl or perfluoroalkyl, where adjacent R$^3$ groups may be joined together to form a 5- or 6-membered aliphatic ring;

Ar$^3$ through Ar$^6$ are the same or different and are selected from the group consisting of aryl groups; and e is the same or different at each occurrence and is an integer from 0 to 5

In some embodiments, the dopant is a green light-emitting material. Some non-limiting examples of green dopants are compounds D8 through D13 shown below.

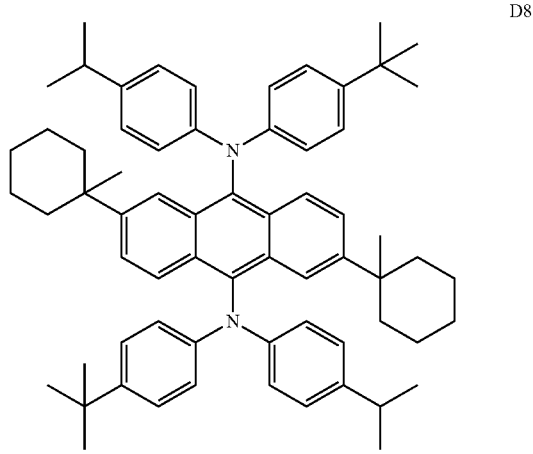

D8

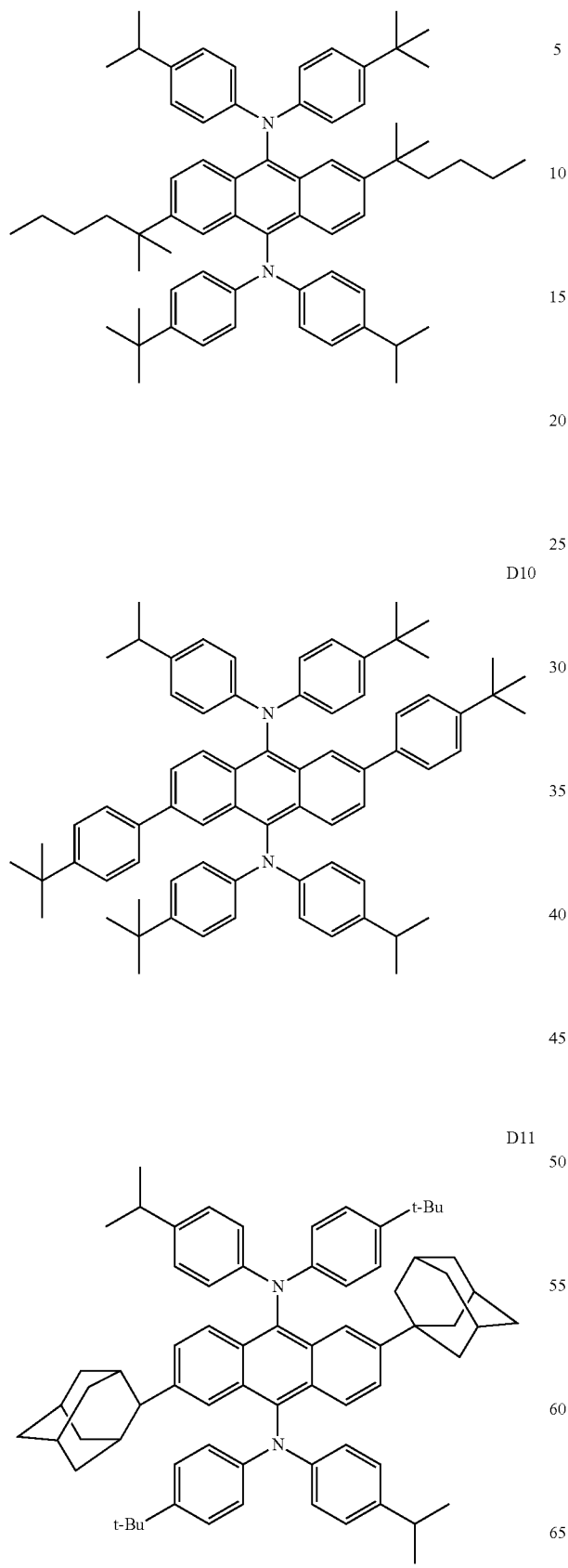
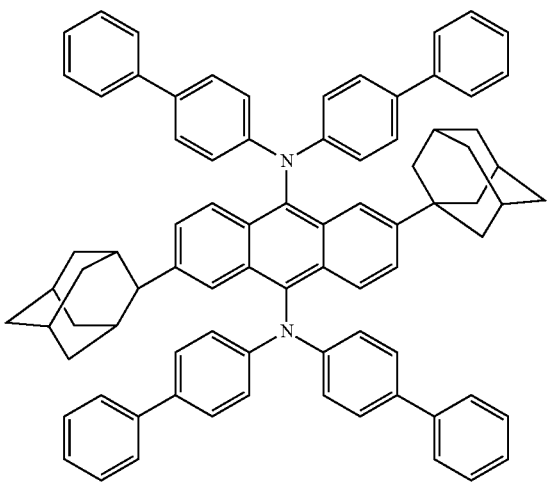
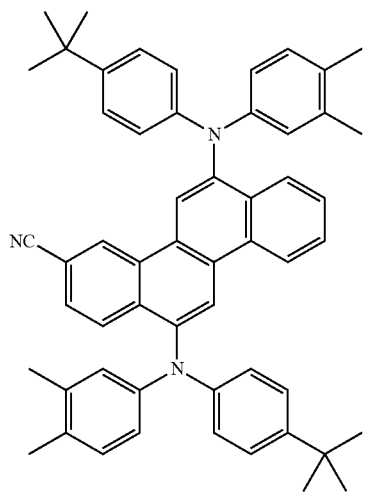
In some embodiments, the electroluminescent dopant is a blue light-emitting material. Some non-limiting examples of blue dopants are compounds D14 through D18 shown below.

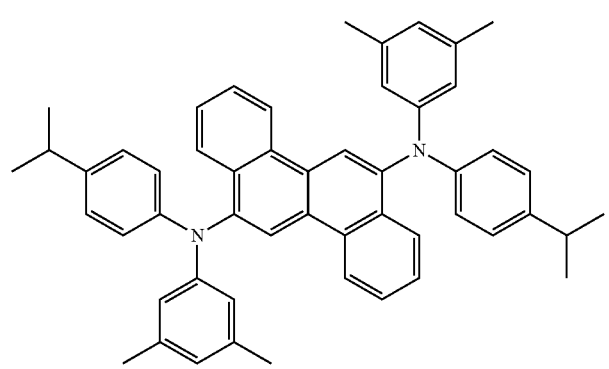
D14
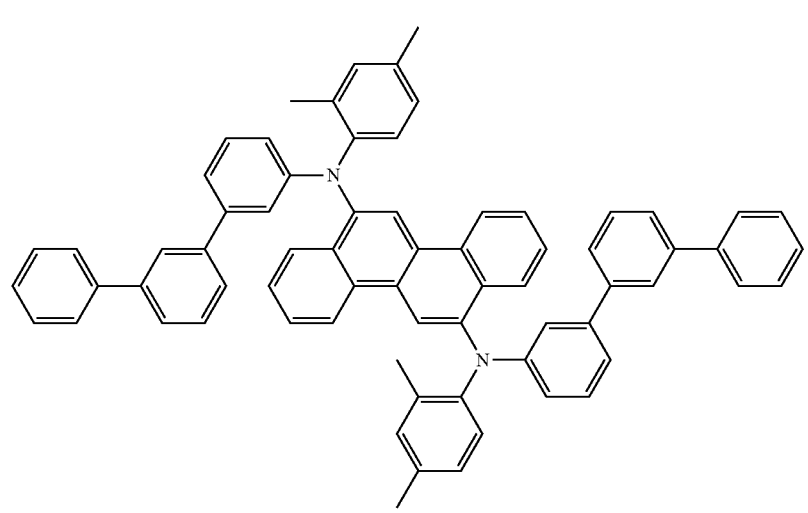
D15
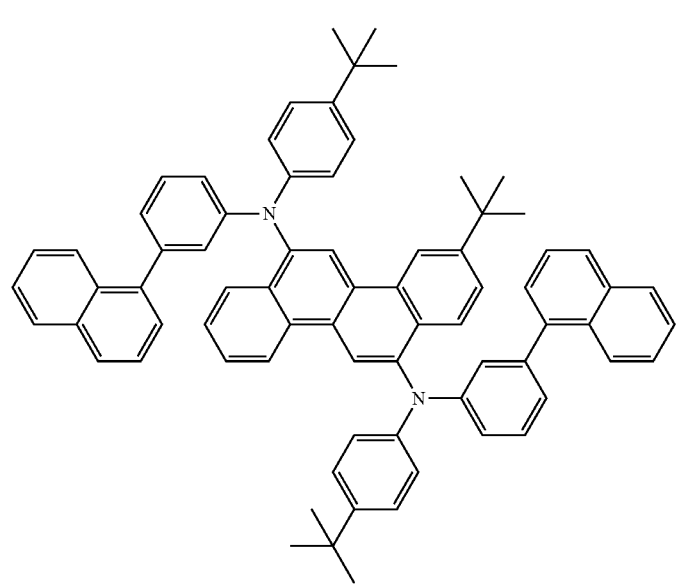
D16

-continued

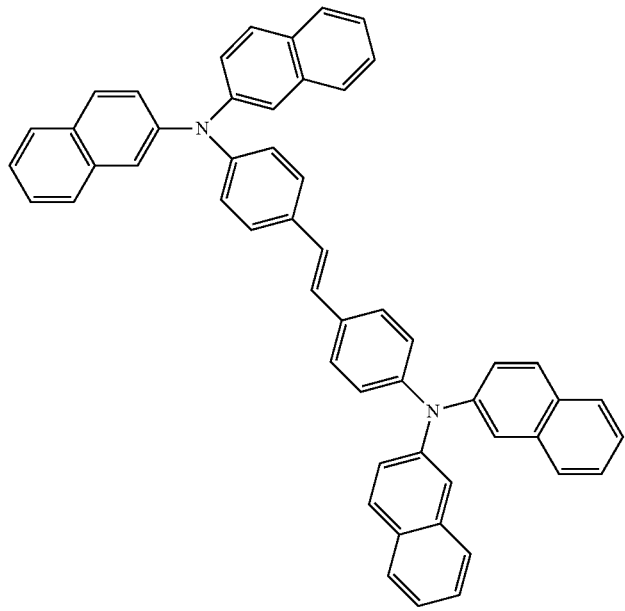

D17

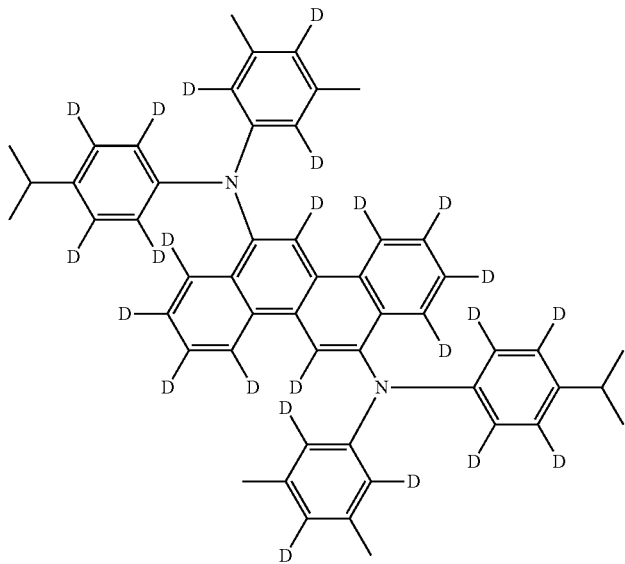

D18

4. ELECTRONIC DEVICE

Organic electronic devices that may benefit from having one or more layers comprising the chrysene derivative materials described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and an electroactive layer 140 between them. Adjacent to the anode is a hole injection layer 120, sometimes referred to as a buffer layer. Adjacent to the hole injection layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

In one embodiment, the different layers have the following range of thicknesses: anode 110, 500-5000 Å, in one embodiment 1000-2000 Å; hole injection layer 120, 50-2000 Å, in one embodiment 200-1000 Å; hole transport layer 130, 50-2000 Å, in one embodiment 200-1000 Å; electroactive layer 140, 10-2000 Å, in one embodiment 100-1000 Å; electron transport layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the electroactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector or a biosensor). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966). Examples of biosensors include pulse oximeters which sense the change in oxygen bound to hemoglobin by measuring the in/out red light intensity.

The electroactive compositions described herein are useful as the electroactive layer 140. The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," *Nature* vol. 357, pp 477-479 (11 Jun. 1992). At least one of the anode and cathode is desirably at least partially transparent to allow the generated light to be observed.

The hole injection layer 120 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapor deposited or deposited from liquids which may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer can comprise charge transfer compounds, and the like, such as copper phthalocyanine and the tetrathiafulvalene-tetracyanoquinodimethane system (TTF-TCNQ). In some embodiments, the hole injection layer comprises at least one electrically conductive polymer and at least one fluorinated acid polymer. Such materials have been described in, for example, published U.S. patent applications 2004-0102577, 2004-0127637, and 2005/205860

Layer 130 comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl) biphenyl (CBP); 1,3-bis(carbazol-9-yl)benzene (mCP); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Layer 140 comprises the new electroactive composition described herein. In some embodiments, one or more additional host materials are present. In some embodiments, one or more additional dopant materials are present. In some embodiments, layer 140 consists essentially of (a) a host material having Formula I and (b) an electroactive dopant capable of electroluminescence having an emission maximum between 380 and 750 nm. In some embodiments, layer 140 consists essentially of (a) a host material having Formula I, (b) an electroactive dopant capable of electroluminescence having an emission maximum between 380 and 750 nm, and (c) a second host material. In some embodiments, the second host material is selected from the group consisting of phenanthrolines, quinoxalines, phenylpyridines, benzodifurans, and metal quinolinate complexes.

Layer 150 can function both to facilitate electron transport, and also serve as a hole injection layer or confinement layer to prevent quenching of the exciton at layer interfaces. Preferably, this layer promotes electron mobility and reduces exciton quenching. Examples of electron transport materials which can be used in layer 150 include metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1, 2,4-triazole (TAZ), and 1,3,5-tri(phenyl-2-benzimidazole)

benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport material is selected from the group consisting of metal quinolates and phenanthroline derivatives. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as L1 quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage.

It is known to have other layers in organic electronic devices. For example, there can be a layer (not shown) between the anode 110 and hole injection layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device is fabricated by liquid deposition of the hole injection layer, the hole transport layer, and the electroluminescent layer, and by vapor deposition of the anode, the electron transport layer, an electron injection layer and the cathode.

It is understood that the efficiency of devices made with the electroactive compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

EXAMPLES

The concepts described herein will be further described in the following examples, which do not limit the scope of the invention described in the claims.

Example 1

This example illustrates the preparation of compound C1.

a. Preparation of 3-Bromochrysene

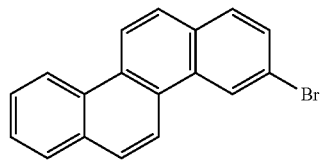 [SMILES: Brc1ccc2ccc3c4ccccc4ccc3c2c1]

(i) Preparation of 1-(4-bromostyryl)naphthalenes

An oven-dried two-liter four-neck round-bottom flask was equipped with a magnetic stir bar, addition funnel, thermometer adapter and nitrogen inlet and charged (1-napthylmethyl) triphenylphosphonium chloride (49.87 g, 113.6 mmol) and dry THF (970 ml). The slurry was cooled to −5° C. and n-BuLi (50 ml, 125 mmol, 2.5 M solution) was added via addition funnel over the period of 25 min. Residual n-BuLi was washed out of the addition funnel with 10 mL of THF. A very dark red solution formed and was left to stir for 15 min. Reaction mixture was then cooled to −75° C. and 4-bromobenzaldehyde (21.0 g, 113.6 mmol) dissolved in dry THF (ca. 75 ml) was added dropwise over 30 min, keeping the temp at −75° C. Residual aldehyde was washed out of the addition funnel with 20 mL of THF. Reaction mixture was left in the cold bath to gradually warm up to rt while stirring overnight. Next day, reaction was quenched with water (30 ml) and volatiles were removed on the rotavap. Residue was stirred in 500 ml of hexane and then filtered. Solids were washed with hexane. Filtrate was concentrated to give crude product which was purified by column chromatography (0-100% $CH_2Cl_2$ in hexanes). Yield 17.7 g (50%). Structure was confirmed by $^1H$ NMR spectroscopy.

(ii) Preparation of 3-bromochrysene 1-(4-Bromostyryl)naphthalenes (5.0 g, 16.2 mmol) were dissolved in dry toluene (1 l) in a one-liter photochemical vessel, equipped with nitrogen inlet and a stir bar. A bottle of dry propylene oxide was cooled in ice-water before 100 ml of the epoxide was withdrawn with a syringe and added to the reaction mixture. Iodine (4.2 g, 16.5 mmol) was added last. Condenser was attached on top of the photochemical vessel and halogen lamp (Hanovia, 450 W) was turned on. Reaction was stopped by turning off the lamp when no more iodine was left in the reaction mixture, as evidenced by the disappearance of its color. The reaction was complete in two hours.

Toluene and excess propylene oxide were removed under reduced pressure to yield a dark yellow solid. Crude product was washed with diethyl ether to give 3.4 g (68%) of 3-bromochrysene as an off-white solid. Structure was confirmed by $^1$H NMR spectroscopy.

b. Preparation of N-([1,1'-biphenyl]-4-yl)-[1,1':3',1''-terphenyl]-4-amine

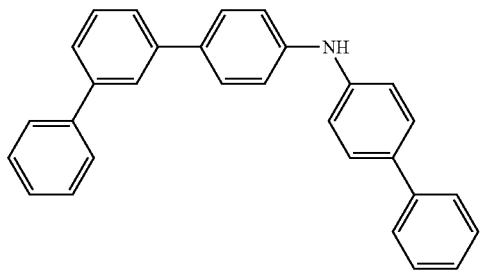 [SMILES: c1ccc(-c2ccc(Nc3ccc(-c4cccc(-c5ccccc5)c4)cc3)cc2)cc1]

In a drybox, 4-aminobiphenyl (0.542 g) and 4-bromo-1,1':3',1''-terphenyl (0.89 g) were combined in a round-bottom flask and dissolved in 10 ml of dry toluene. Tris(tert-butyl) phosphine (0.022 g, 0.11 mmol) and tris(dibenzylideneacetone) dipalladium(0) (0.05 g, 0.055 mmol) were dissolved in 10 ml of dry toluene and stirred for 5 minutes. The catalyst solution was added to the reaction mixture, stirred for 2 minutes and was followed by sodium tert-butoxide (0.32 g, 3.3 mmol). Flask was capped and left to stir in the drybox overnight at room temperature. Next day, reaction mixture was taken out of the box and filtered through a one-inch plug of silica gel topped with celite, washing with 500 ml of dichloromethane. Removal of volatiles under reduced pressure gave a yellow solid. Crude product was purified by trituration with diethyl ether to give 0.85 g (73%) of a white solid. Structure was confirmed by $^1$H NMR spectroscopy.

c. Preparation of C1

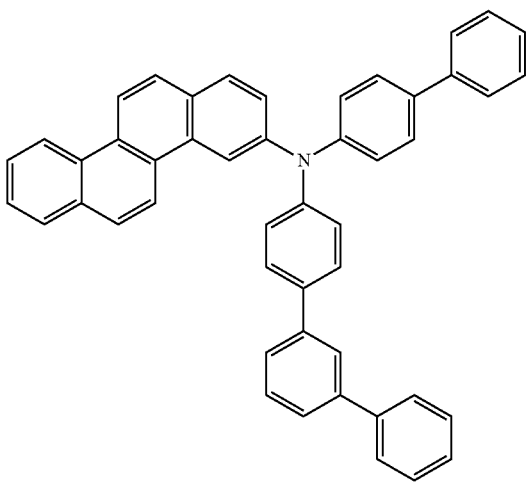 [SMILES: c1ccc(-c2ccc(N(c3ccc(-c4cccc(-c5ccccc5)c4)cc3)c3ccc4ccc5c6ccccc6ccc5c4c3)cc2)cc1]

In a drybox, N-([1,1'-biphenyl]-4-yl)-[1,1':3',1''-terphenyl]-4-amine (2.02 mmol) and 3-bromochrysene (1.85 mmol) were combined in a thick-walled glass tube and dissolved in 20 ml of dry toluene. Tris(tert-butyl)phosphine (7.5 mg, 0.037 mmol) and tris(dibenzylideneacetone) dipalladium(0) (17 mg, 0.019 mmol) were dissolved in 10 ml of dry toluene and stirred for 10 minutes. The catalyst solution was added to the reaction mixture, stirred for 5 minutes and followed by sodium tert-butoxide (0.194 g, 2.02 mmol) and 20 ml of dry toluene. After another 10 minutes, the reaction flask was brought out of the drybox and placed into an 80° C. bath to stir overnight. Next day, reaction mixture was cooled to room temperature and filtered through a three-inch plug of silica gel and topped with half an inch of Celite, washing with 400 ml of chloroform. Removal of volatiles under reduced pressure gave a yellow solid. Crude product was purified by column chromatography with chloroform in hexane. Yield 1.05 g (87.5%) of a white solid. Identity and purity of the product were established by $^1$H NMR, mass spectrometry and liquid chromatography. The properties of the compound are given in Table 1.

Example 2

This example illustrates the preparation of Compound C3.

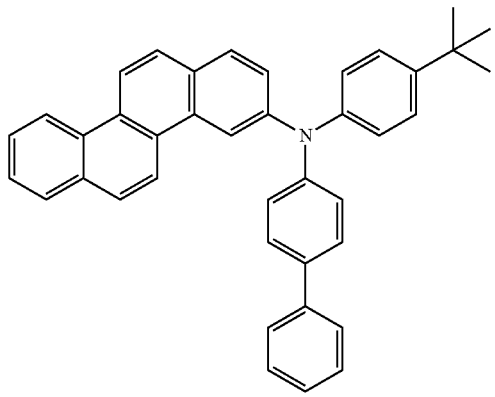 [SMILES: CC(C)(C)c1ccc(N(c2ccc(-c3ccccc3)cc2)c2ccc3ccc4c5ccccc5ccc4c3c2)cc1]

a. Preparation of 3-Bromochrysene

3-Bromochrysene was prepared from (1-napthylmethyl) triphenylphosphonium chloride and 4-bromobenzaldehyde using the procedure described in Example 1, part a.

b. Preparation of N-(biphenyl-4-yl)-N-(4-tert-butylphenyl)chrysene-3-amine, Compound C3

In a drybox, 3-bromochrysene (0.869 g, 2.83 mmol) and N-(4-tert-butylphenyl)biphenyl-4-amine (0.9 g, 2.97 mmol) were combined in a thick-walled glass tube and dissolved in 20 ml of dry o-xylene. Tris(tert-butyl)phosphine (0.01 g) and tris(dibenzylideneacetone) dipalladium(0) (0.023 g) were dissolved in 10 ml of dry o-xylene and stirred for 10 minutes. The catalyst solution was added to the reaction mixture, stirred for 5 minutes and followed by sodium tert-butoxide (0.27 g, 2.83 mmol) and 25 ml of dry o-xylene. After another 10 minutes, the reaction flask was brought out of the drybox, attached to a nitrogen line and stirred at 75° C. overnight. Next day, reaction mixture was cooled to room temperature and filtered through a one-inch plug of silica gel and one inch of celite, washing with dichloromethane. Removal of volatiles under reduced pressure gave a solid which was triturated with diethyl ether. Yield 1.27 g (85.2%). Identity of the product was established by $^1$H NMR. The compound properties are given in Table 1.

Compounds C4 and C5 were made using analogous procedures. The properties of these compounds are given in Table 1.

Example 3

This example illustrates the preparation of Compound C2 a. Preparation of Perdeutero-3-bromochrysene

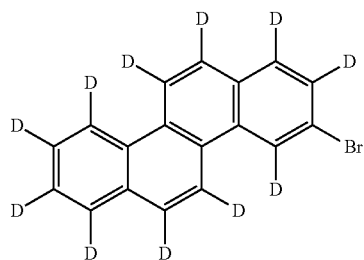 [SMILES: [2H]c1c([2H])c([2H])c2c(c1[2H])c([2H])c([2H])c1c3c([2H])c(Br)c([2H])c([2H])c3c([2H])c([2H])c21]

3-Bromochrysene was prepared from (1-napthylmethyl) triphenylphosphonium chloride and 4-bromobenzaldehyde using the procedure described in Example 1, part a.

In the glove box, 3-bromochrysene (2 g, 6.5 mmol) was placed into a flask and dissolved in 100 ml of dry $C_6D_6$. Aluminum trichloride (0.26 g, 1.95 mmol) was added next, followed by 20 ml of additional $C_6D_6$. Reaction mixture darkened within five minutes and was left to stir for 30 minutes. The mixture was quenched with $D_2O$ (20 ml), stirred for 25 min (dark color went away), and transferred to a separatory funnel. Organic layer was removed and washed with water (twice) and brine (three times). The organic phase was dried over $MgSO_4$ and then concentrated to give crude product, which was triturated with diethyl ether. Yield 1.8 g (87%) of white solid. The product is 95.4% deuterated as determined by $^1H$ NMR spectroscopy against an internal standard. Identity and purity of the product were established by mass spectrometry and liquid chromatography.

b. Preparation of Perdeutero-N-([1,1'-biphenyl]-4-yl) [1,1':3',1''-terphenyl]-4-amine

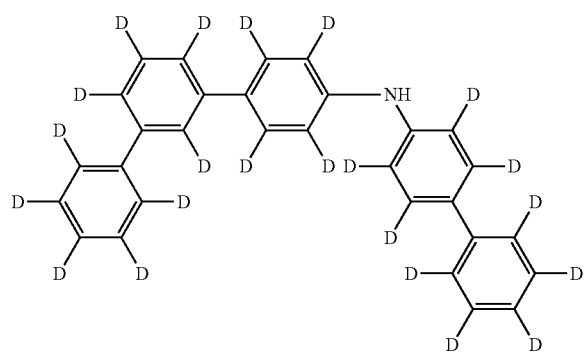 [SMILES: [2H]c1c([2H])c([2H])c(-c2c([2H])c([2H])c(Nc3c([2H])c([2H])c(-c4c([2H])c([2H])c([2H])c(-c5c([2H])c([2H])c([2H])c([2H])c5[2H])c4[2H])c([2H])c3[2H])c([2H])c2[2H])c([2H])c1[2H]]

Deuteration of 4-bromobiphenyl and 4-bromo-1,1':3',1''-terphenyl was done as described above for perdeutero-3-bromochrysene. Identity and purity of the products were established by $^1H$ NMR spectroscopy, mass spectrometry and liquid chromatography.

(i) Preparation of perdeutero-4-aminobiphenyl

In a drybox, [1,1'-biphenyl]-2-yldicyclohexylphosphine (34.7 mg, 0.099 mmol), tris(dibenzylideneacetone) dipalladium(0) (37.8 mg, 0.041 mmol) and lithium hexamethyldisilazide (1.66 g, 9.91 mmol) were placed into a thick-walled glass tube. Perdeutero-4-bromobiphenyl was dissolved in 19 ml of toluene and added to the mixture. Tube was sealed, taken out of the box and heated at 80° C. for 16 hours. Reaction mixture was cooled to rt and quenched with 80 ml of 1M aqueous HCl. The mixture was stirred for five minutes and then neutralized with 2M aqueous NaOH to pH=11. Organics were extracted with $CH_2Cl_2$ (2×40 ml), then dried with brine (150 ml) and $Na_2SO_4$. Volatiles were removed on the rotavap. Crude product was purified by flash column chromatography (70 to 85% $CH_2Cl_2$ in hexanes). Yield 820 mg (56%). The product maintained its degree of deuteration as determined by $^1H$ NMR spectroscopy against an internal standard. Identity and purity of the product were established by $^1H$ NMR spectroscopy, mass spectrometry and liquid chromatography.

(ii) Preparation of Perdeutero-N-([1,1'-biphenyl]-4-yl)-[1,1':3',1''-terphenyl]-4-amine In a drybox, perdeutero-4-aminobiphenyl (0.542 g, 3.04 mmol) and perdeutero-4-bromo-1,1':3',1''-terphenyl (0.89 g, 2.76 mmol) were combined in a round-bottom flask and dissolved in 10 ml of dry toluene.

Tris(tert-butyl)phosphine (0.022 g, 0.11 mmol) and tris (dibenzylideneacetone) dipalladium(0) (0.05 g, 0.055 mmol) were dissolved in 10 ml of dry toluene and stirred for 5 minutes. The catalyst solution was added to the reaction mixture, stirred for 2 minutes and was followed by sodium tert-butoxide (0.32 g, 3.3 mmol). Flask was capped and left to stir in the drybox overnight at room temperature. Next day, reaction mixture was taken out of the box and filtered through a one-inch plug of silica gel topped with celite, washing with 500 ml of dichloromethane. Removal of volatiles under reduced pressure gave a yellow solid. Crude product was purified by trituration with diethyl ether to give 0.85 g (73%) of a white solid. The product is 80% deuterated as determined by $^1H$ NMR spectroscopy against an internal standard. Identity and purity of the product were established by mass spectrometry and liquid chromatography.

c. Preparation of Perdeutero-N-([1,1'-biphenyl]-4-yl)-N-([1,1':3',1''-terphenyl]-4-yl)chrysen-3-amine, Compound C2

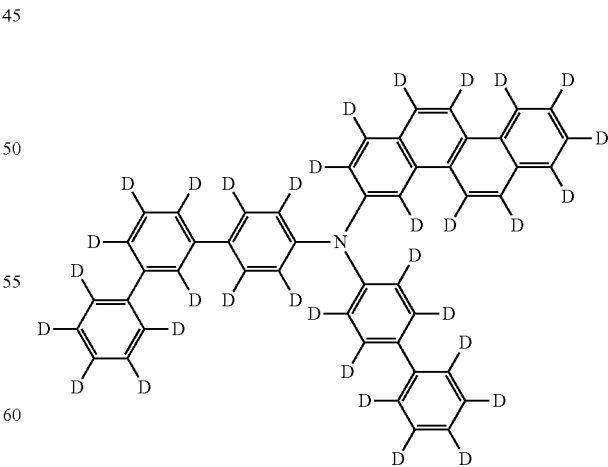

In a drybox, perdeutero-N-([1,1'-biphenyl]-4-yl)-[1,1':3',1''-terphenyl]-4-amine (0.849 g, 2.02 mmol) and perdeutero-3-bromochrysene (0.59 g, 1.85 mmol) were combined in a thick-walled glass tube and dissolved in 20 ml of dry toluene.

Tris(tert-butyl)phosphine (7.5 mg, 0.037 mmol) and tris(dibenzylideneacetone) dipalladium(0) (17 mg, 0.019 mmol) were dissolved in 10 ml of dry toluene and stirred for 10 minutes. The catalyst solution was added to the reaction mixture, stirred for 5 minutes and followed by sodium tert-butoxide (0.194 g, 2.02 mmol) and 20 ml of dry toluene. After another 10 minutes, the reaction flask was brought out of the drybox and placed into an 80° C. bath to stir overnight. Next day, reaction mixture was cooled to room temperature and filtered through a three-inch plug of silica gel and topped with half an inch of Celite, washing with 400 ml of chloroform. Removal of volatiles under reduced pressure gave a yellow solid. Crude product was purified by column chromatography with chloroform in hexane. Yield 1.05 g (87.5%) of a white solid. Identity and purity of the product were established by mass spectrometry and liquid chromatography. The solubility properties of compound C2 are very similar to those of compound C1, given in Table 1.

TABLE 1

Compound Properties

| Compound | Tg (° C.) | Solubility (mg/ml) | |
|---|---|---|---|
| | | toluene | anisole |
| C1 | 110 | 24.6 | 23.9 |
| C3 | 105 | 22.2 | 22.4 |
| C4 | 120 | 1.0 | 3.6 |
| C5 | 116 | 24.4 | 23.7 |

Examples 4 and 5

These examples demonstrate the fabrication and performance of devices having an electroactive layer with a red dopant, a first host having Formula I, and a second host material.

In Example 4, the first host is Compound C1.
In Example 5, the first host is Compound C2.

The second host material, host 2, is a phenanthroline derivative having electron transport properties and was also used as the electron transport material. The structure is shown below.

The device had the following structure on a glass substrate:
Indium Tin Oxide (ITO): 50 nm
hole injection layer=HIJ-1 (50 nm), which is an aqueous dispersion of an electrically conductive polymer and a polymeric fluorinated sulfonic acid. Such materials have been described in, for example, published U.S. patent applications US 2004/0102577, US 2004/0127637, US 2005/0205860, and published PCT application WO 2009/018009.
hole transport layer=HT-1 (20 nm), which is an triarylamine-containing copolymer. Such materials have been described in, for example, published PCT application WO 2009/067419.
electroluminescent layer=first host:host 2:D7 in a weight ratio of 67:25:8 (75 nm)
electron transport layer=host 2 (10 nm)
cathode=CsF/Al (0.7/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a solution of a hole transport material, and then heated to remove solvent. After cooling the substrates were spin-coated with solution of the electroactive layer materials in toluene, and heated to remove solvent. The substrates were masked and placed in a vacuum chamber. The electron transport layer was deposited by thermal evaporation, followed by a layer of CsF. Masks were then changed in vacuo and a layer of Al was deposited by thermal evaporation. The chamber was vented, and the devices were encapsulated using a glass lid, dessicant, and UV curable epoxy.

host 2

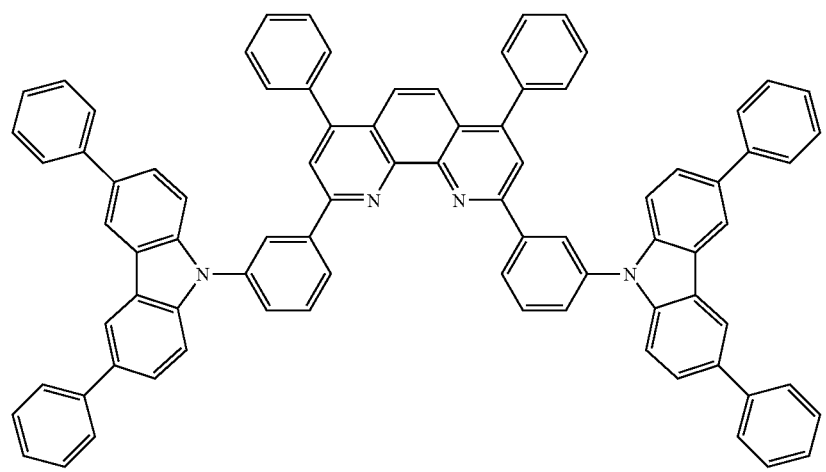

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The results are given in Table 2.

TABLE 2

Device Performance

| Ex. | First Host | CIE (x, y) | Voltage (V) | C.E. (cd/A) | E.Q.E. (%) | P.E. (lm/W) | Lifetest current density (mA/cm2) | Lifetest Luminance (nits) | Raw T50 (h) | Projected Lifetime T50 @1000 nits |
|---|---|---|---|---|---|---|---|---|---|---|
| 4 | C1 | 0.680, 0.318 | 5.9 | 13.6 | 17.1 | 7.3 | 129 | 8698 | 1400 | 68,700 |
| 5 | C2 | 0.680, 0.318 | 5.6 | 13.8 | 17.2 | 7.7 | 123 | 8366 | 2300 | 105,000 |

\* All data @ 1000 nits,
C.E. = current efficiency
CIEx and CIEy are the x and y color coordinates according to the C.I.E. chromaticity scale (Commission Internationale de L'Eclairage, 1931).
E.Q.E is the external quantum efficiency;
P.E. is the power efficiency.
Raw T50 is the time in hours for a device to reach one-half the initial luminance at the lifetest luminance given.
Projected T50 is the projected lifetime at 1000 nits using an accelerator factor of 1.8.

Examples 6 and 7

This example demonstrates the air stability and moisture insensitivity of an electroluminescent composition with a red dopant, a first host having Formula I, and a second host material. The second host material, host 3, is a phenanthroline derivative having electron transport properties. The structure is shown below.

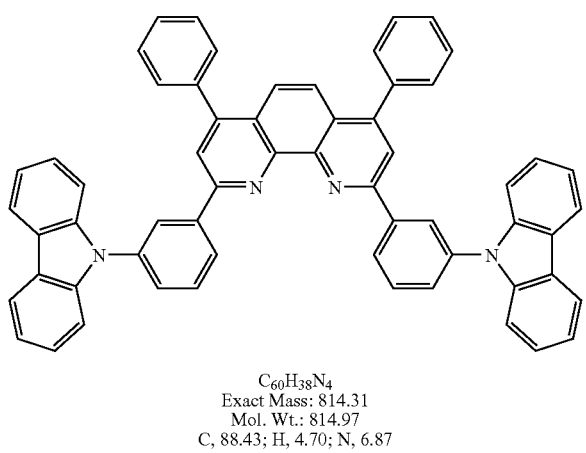

host 3

$C_{60}H_{38}N_4$
Exact Mass: 814.31
Mol. Wt.: 814.97
C, 88.43; H, 4.70; N, 6.87

The devices for examples 6 and 7 were made identically with the exception of the treatment of the solutions containing the hosts and electroluminescent dopant. Both solutions were in toluene, with 1.35% solids, by weight. Prior to device fabrication, the solution for example 6 was stored in an argon filled glove box overnight, while the for example 7 was stored under ambient air and humidity conditions overnight.

The devices had the following structure on a glass substrate:

Indium Tin Oxide (ITO): 80 nm hole injection layer=HIJ-1 (65 nm)

hole transport layer=HT-2 (20 nm), which is a fluorene-triarylamine copolymer. Such materials have been described in, for example, published U.S. patent application US 2008-0071049.

electroactive layer=C3:host 3:D7 in a weight ratio of 75:17:8 (50 nm)

electron transport layer=2,4,7,9-tetraphenylphenanthroline (20 nm)

cathode=CsF/Al (0.7/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a solution of a hole transport material, and then heated to remove solvent. After cooling the substrates were spin-coated with the electroactive solutions discussed above, and heated to remove solvent. The substrates were masked and placed in a vacuum chamber. The electron transport layer was deposited by thermal evaporation, followed by a layer of CsF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The results are given in Table 3 below.

TABLE 3

| | | | | | Lifetest | | | |
| | | | | | current | Lifetest | Raw | |
| CIE | Voltage | C.E. | E.Q.E. | P.E. | density | Luminance | T50 | Lifetime T50 |
| Ex. (x, y) | (V) | (cd/A) | (%) | (lm/W) | (mA/cm$^2$) | (nits) | (h) | @1000 nits |
|---|---|---|---|---|---|---|---|---|
| 6  0.679, 0.318 | 4.4 | 13.8 | 16.2 | 10.0 | 71 | 8284 | 490 | 22,000 |
| 7  0.679, 0.318 | 4.5 | 13.8 | 16.3 | 9.8 | 76 | 8557 | 473 | 22,500 |

All data @ 1000 nits,
C.E. = current efficiency;
CIEx and CIEy are the x and y color coordinates according to the C.I.E. chromaticity scale (Commission Internationale de L'Eclairage, 1931).
E.Q.E is the external quantum efficiency;
P.E. is the power efficiency.
Raw T50 is the time in hours for a device to reach one-half the initial luminance at the lifetest luminance given.
Projected T50 is the projected lifetime at 1000 nits using an accelerator factor of 1.8.

It can be seen from the above results, that the materials stored in air and exposed to oxygen and moisture (Example 7), performed as well as materials stored under argon, with virtually no exposure to oxygen and moisture (Example 6). With many host materials, such exposure to oxygen and/or moisture results in significant deterioration of device performance, especially device lifetime.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A compound having Formula I

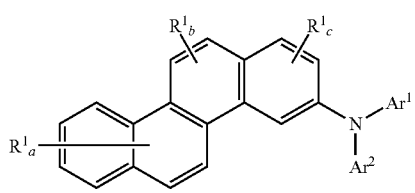

Formula I where:

R$^1$ is the same or different at each occurrence and is selected from the group consisting of H, D, alkyl, alkoxy, silyl, and siloxane, or adjacent R$^1$ groups may be joined together to form a 5- or 6-membered aliphatic ring, Ar$^1$ and Ar$^2$ are the same or different and are aryl groups, a is an integer from 1 to 6;

b is an integer from 1 to 2;

c is an integer from 1 to 3; and wherein at least one R$^1$ is D.

2. The compound of claim 1, wherein R$^1$ is D.

3. The compound of claim 1, wherein R$^1$ is D, a=5-6, b=1-2 and c=2-3.

4. The compound of claim 1, wherein at least one R$^1$ is a branched alkyl group.

5. The compound of claim 1, wherein Ar$^1$ and Ar$^2$ are selected from the group consisting of phenyl, biphenyl, naphthyl, phenanthryl, anthracenyl, 4-naphthylphenyl, 4-phenanthrylphenyl, where any of the preceding groups may be further substituted with one or more substituents selected from the group consisting of D, alkyl groups, silyl groups, and phenyl, and a group having Formula II:

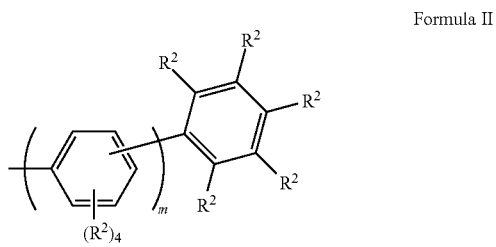

Formula II where:

R$^2$ is the same or different at each occurrence and is selected from the group consisting of H, D, alkyl, alkoxy, siloxane and silyl, or adjacent R$^2$ groups may be joined together to form an aromatic ring; and m is the same or different at each occurrence and is an integer from 1 to 6.

6. The compound of claim 1, wherein $Ar^1$ and $Ar^2$ are selected from the group consisting of phenyl, biphenyl, terphenyl, naphthylphenyl, and deuterated analogs thereof.

7. The compound of claim 1, wherein $Ar^1 \neq Ar^2$.

8. A chrysene compound selected from the group consisting of compounds C1 and C5:

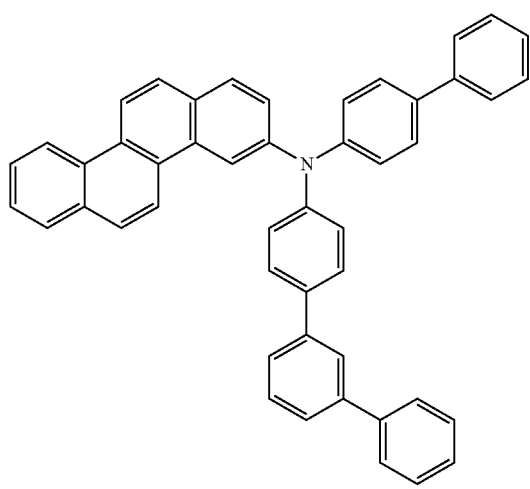

C1

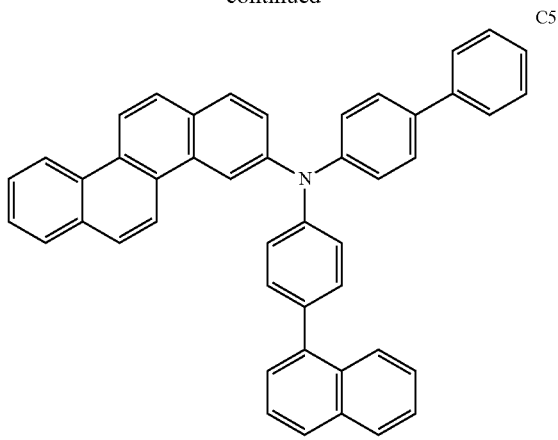

C5 and
wherein each of the above compounds C1 and C5 is deuterated.

9. The chrysene compound of claim 1, wherein the compound is C2:

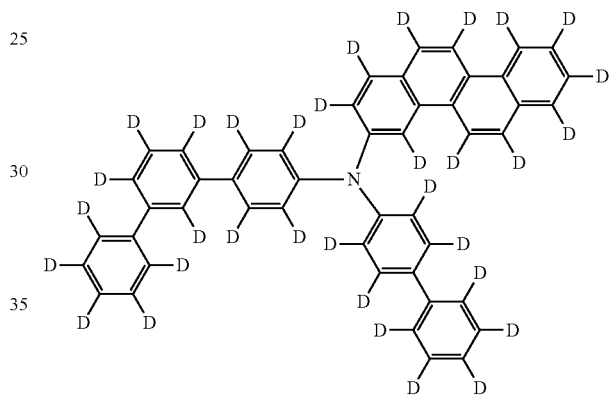

* * * * *